United States Patent
Watanabe et al.

(10) Patent No.: US 6,656,838 B2
(45) Date of Patent: *Dec. 2, 2003

(54) PROCESS FOR PRODUCING SEMICONDUCTOR AND APPARATUS FOR PRODUCTION

(75) Inventors: Tomoji Watanabe, Tsuchiura (JP); Akiko Kagatsume, Tsuchiura (JP); Tadanori Yoshida, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/150,950

(22) Filed: May 21, 2002

(65) Prior Publication Data

US 2002/0137334 A1 Sep. 26, 2002

Related U.S. Application Data

(63) Continuation of application No. 09/787,242, filed on Mar. 16, 2001, now Pat. No. 6,403,479.

(51) Int. Cl.$^7$ .................... H01L 21/44; H01L 21/31; C23C 16/00; C23C 8/00
(52) U.S. Cl. .................. 438/680; 438/758; 427/255.18; 427/255.27; 427/585; 118/715; 118/725
(58) Field of Search ................. 438/680, 758; 427/255.18, 255.27, 585; 118/715, 787

(56) References Cited

U.S. PATENT DOCUMENTS

| | | | |
|---|---|---|---|
| 5,863,598 A | 1/1999 | Venkatesan et al. | 427/97 |
| 6,090,210 A | 7/2000 | Balance et al. | 118/725 |
| 6,100,149 A | 8/2000 | Nenyei et al. | 438/308 |
| 6,287,635 B1 | 9/2001 | Cook et al. | 427/255.18 |
| 6,403,479 B1 * | 6/2002 | Watanabe et al. | 438/680 |

FOREIGN PATENT DOCUMENTS

JP  10-074703  4/1997

* cited by examiner

*Primary Examiner*—Alexander Ghyka
(74) *Attorney, Agent, or Firm*—Antonelli, Terry, Stout & Kraus, LLP

(57) ABSTRACT

To provide a process for producing a semiconductor, which can form a CVD film at a high film-forming rate with a good step coverage, good uniformities of film forming rate and sheet resistance in the in-plane region of a wafer and a good reproducibility at every wafers, and an apparatus for treating a semiconductor for the process. In a treating chamber kept under pressure of 1,000–50,000 Pa, a wafer is placed on a susceptor, and a film is deposited on the wafer by heating the wafer at 500° C. or higher by a plate-shaped heater through the susceptor, while supplying a feed gas into the treating chamber at 500–50,000 sccm through gas injection nozzles provided near the center of a shower plate provided approximately in parallel with the wafer at a distance of 1–20 mm from the wafer and kept at a temperature of 200° C. or lower.

4 Claims, 11 Drawing Sheets

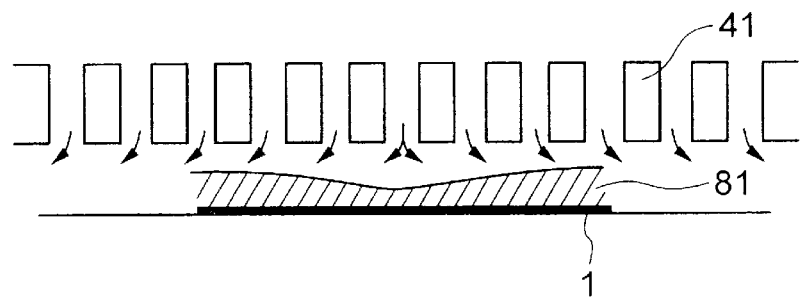
FIG. 7A
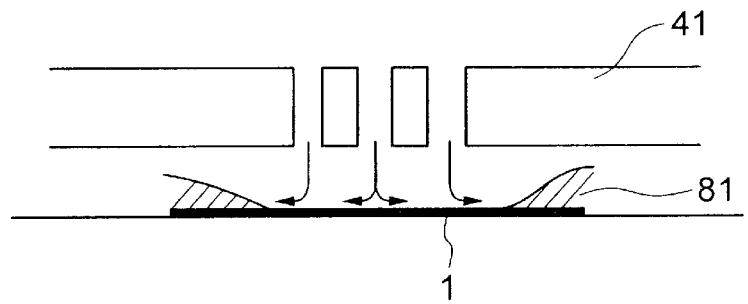
FIG. 7B
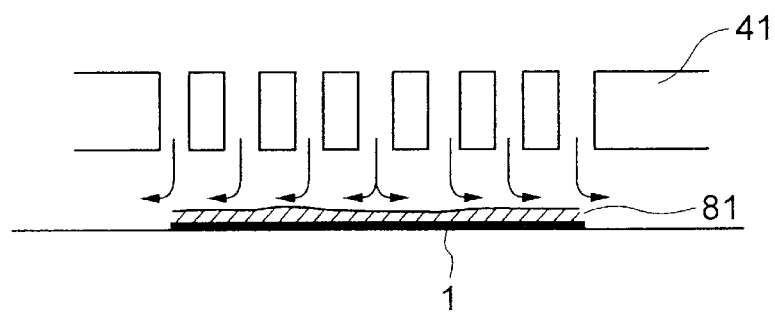
FIG. 7C
FIG. 8
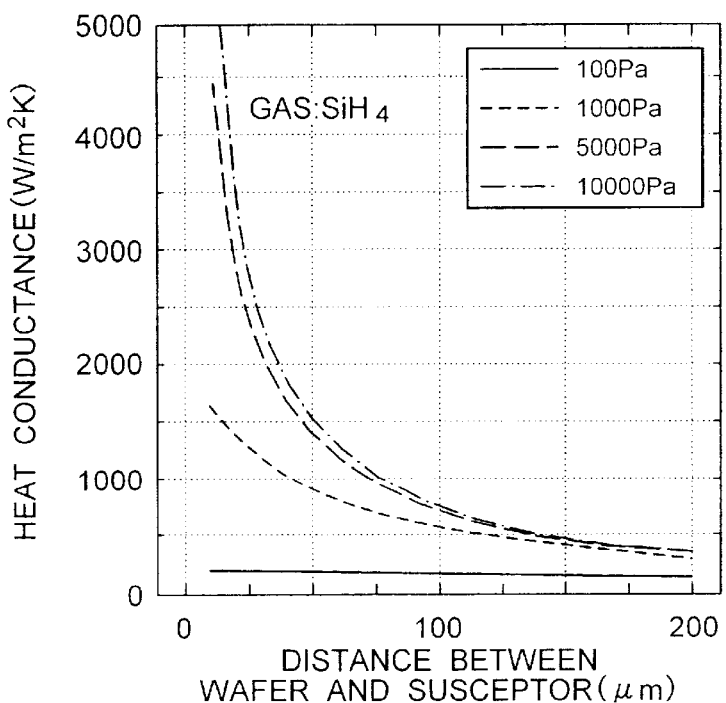

FILM FORMATION BY SILYLENE
FILM FORMATION BY MONOSILANE
SILICON OXIDE FILM

FILM FORMATION BY SILYLENE
FILM FORMATION BY MONOSILANE
SILICON OXIDE FILM

PROCESS FOR PRODUCING SEMICONDUCTOR AND APPARATUS FOR PRODUCTION

CROSS REFERENCE TO RELATED APPLICATIONS

This application is a Continuation Application of application Ser. No. 09/787,242, filed Mar. 16, 2001 now U.S. Pat. No. 6,403,479.

TECHNICAL FIELD

The present invention relates to a process and an apparatus for producing a semiconductor, and more particularly to a process and an apparatus for producing a semiconductor, which can form a CVD film with a good step coverage at a high film-forming rate.

BACKGROUND ART

Production of semiconductor integrated circuits is now making much use of a process for forming a film, i.e. forming a thin film on a wafer by subatmospheric thermal CVD, where it is required to deposit a thin film of uniform thickness with uniform characteristics on a wafer. To fill step gaps around holes, vias, trench, etc. of a high aspect ratio (depth/opening diameter), a high step coverage is required. Voids, when formed in the deposition film on the step gaps due to a low step coverage, will give rise to lowering of reliability or failure of semiconductor integrated circuits.

Heretofore, a batch type CVD apparatus capable of treating a few tens to a hundred and a few tens wafers in one batch has been much used in the subatmospheric thermal CVD process. The batch type CVD apparatus itself has a high throughput and thus improvement of film thickness uniformity and higher step coverage is attained by forming films even at a somewhat low film-forming rate (a few nm/min. or so) under relatively low pressure, e.g. a few tens to a few hundred Pa.

On the other hand, shifting to a single wafer processing type CVD apparatus, which treats wafers one by one, is now gradually taking place. With the recent trend toward larger wafer diameter and more strict requirements for film thickness uniformity, the batch type CVD apparatus is confronting difficulties in keeping the film thickness uniformity not only within the in-place region of wafer, but also throughout wafers. The batch type requires a long treating time for one run and thus is not suitable for more flexible, short TAT (Turn Around Time) production. This is accelerating the shifting tendency.

A well known single wafer processing type CVD apparatus is a lamp heating type apparatus using a halogen lamp as a heat source and its structure is disclosed is JP-A-6-326078, JP-A-10-144619, JP-A-6-293595, etc. The lamp heating type apparatus requires cooling of the lamp by air injection to prevent the lamp durability from lowering due to excessive temperature elevation and thus the lamp cannot be provided in the subatmospheric treating chamber. Instead, the lamp is provided outside the treating chamber to irradiate a wafer or a susceptor (on which a wafer is mounted) with a lamp light through a light-transmissible window provided on one side of the treating chamber.

Another well known single wafer processing type CVD apparatus is an apparatus for heating a wafer mounted on a heater-incorporated stage, and its structure is disclosed in JP-A-9-45624. The stage is in such a structure that a plate type heater divided into a plurality of zones is fixed to the backside of a susceptor having a thickness of a few centimeters, composed of a material of high heat conductivity, and a pair of insulated electrodes are provided on the wafer-mounting side and an insulating film is further provided thereon to constitute an electrostatic chuck. Gas injection nozzles are provided in a circular region around the center of a shower plate, the circular region having a substantially the same diameter as that of the susceptor and a film is formed by injecting a gas through the nozzles, while securing the wafer onto the susceptor by electrostatic force. It is disclosed that the film thickness uniformity within the in-plane region of the wafer can be improved by balancing an injection gas rate against a gas consumption rate.

To make the throughput of the single wafer processing type CVD apparatus equal to that of the batch type, the film-forming rate must be increased to a few tens-a hundred and a few tens nm/min, and thus the film must be formed at a higher film-forming temperature under higher pressure than those of the batch type. The single wafer processing CVD apparatus has had such an inevitable problem as poor step coverage. JP-A-10-74703 discloses a method of improving the step coverage by using a high total pressure (20–300 Torr=2666–39990 Pa), a high silicon-containing gas partial pressure (4–40 Torr=533.2–5332 Pa) and a low temperature (550°–620° C.).

DISCLOSURE OF THE INVENTION

An object of the present invention is to solve the following problems of the prior art.

In the lamp heating type apparatus as disclosed in JP-A-6-326078, JP-A-10-144619, JP-A-6-293595, etc., the lamp cannot be provided too nearer to the wafer or susceptor as a heating target, so that it is difficult to appropriately control distribution of heating rate to the wafer or susceptor. For example, there is such a problem that even if the heating rate is increased only in the peripheral region of high heat radiation, its influence will be propagated even to the central region, resulting in difficulty in making the wafer temperature uniform.

In the heater-heating type apparatus as disclosed in JP-A-9-45624, it is necessary to increase the heat transfer rate to the wafer by elevating the temperature of susceptor (which is referred to as "mounting base" in the reference) in the peripheral region of high heat radiation to make the wafer temperature uniform, as mentioned in the reference. However, it is difficult to elevate the temperature only of susceptor having a high heat conductivity and a thickness as large as a few centimeters, and the temperature of the central region is also elevated to a higher level by heat transfer through the susceptor than as required. Furthermore, the heat capacity of the susceptor is so large that the susceptor surface temperature cannot be elevated rapidly even by increasing the heat generation rate of heater, and it is difficult to change a heat transfer rate to the wafer with a good responsibility. Therefore, it is difficult to make the wafer mounted on the susceptor reach a desired temperature for a short time and there is such a problem that the susceptor temperature is gradually changed during the continuous treatment of wafers. Still furthermore, no consideration has been paid to the fact that a film is deposition also on the susceptor surface acting to secure the wafer by electrostatic force. Particularly in case that a conductive film such as a phosphorus-doped silicon film is deposited on the upper side of a susceptor so as to cover electrodes having different polarities of a dipole type electrostatic chuck, charges migrate through the deposited film, resulting in such a problem failure to secure the wafer by electrostatic force.

As a result of numerical simulation studies based on information disclosed in JP-A-10-74703, the present inventors have found that only control of film-forming conditions within said range has a limit to improvement of step coverage, and no desired step coverage can be obtained at such film-forming rates as required by the present inventors.

FIG. 23 shows results of simulation of relations between film-forming rates and step coverage (film thickness at hole inside/film thickness in flat part×100%) when a silicon film is formed by introduction of monosilane ($SiH_4$), phosphine ($pH_3$) and hydrogen ($H_2$), where hole aspect ratio is set to 2. Continuous line shows a case that total pressure is 13320 Pa and monosilane partial pressure is 600 Pa, dotted line shows a case that total pressure is 21310 Pa and monosilane partial pressure is 1000 Pa, and alternate long and short dash line shows a case that total pressure is 42620 Pa and monosilane partial pressure is 2000 Pa. Mark "○" shows film formation at the wafer temperature of 580° C., "△" shows film formation at the wafer temperature of 600° C. and "□" shows film formation at the wafer temperature of 620° C. Comparison at the same film-forming rate reveals that the step coverage can be improved by increasing a monosilane partial pressure from 600 Pa to 1,000 Pa and further to 2,000 Pa and by decreasing a wafer temperature from 620° C. down to 600° C. and further down to 580° C., but comparison at the same temperature reveals that the step coverage is lowered with increasing monosilane partial pressure and the upper limit of step coverage is lowered with increasing film-forming rate, resulting in a failure to attain 90% or higher step coverage at such a film-forming rate of 30 nm–100 nm/min as required by the present inventors.

Such lowering of step coverage is due to the active gas formed by gas phase reaction of feed gases, that is, the intermediate having a higher deposition probability to the wafer than that of feed gases. In case of monosilane, silylene ($SiH_2$) is formed as an intermediate by gas phase reaction, and the deposition probability of silylene is very high, i.e. about 1.0, irrespective of temperatures, whereas that of monosilane is $10^{-6}$, $10^{-7}$ at 600° C. The intermediate of a high deposition probability deposits thick around the hole openings and deposition does not so much take place, at the inside of the holes, as disclosed in "Flows of Atoms and Molecules, compiled by the Japan Society of Mechanical Engineers, pages 192–198 (1996)", and thus the step coverage is lowered. FIG. 24 schematically shows film formation at the inside of a hole, where modes of silicon film formation at the inside of the hole composed of silicon oxide film are shown. Actually, film formation by monosilane and that by silylene proceed simultaneously, but for simplicity's sake the thickness of film formed by deposition of monosilane on the surface and that formed by deposition of monosilane on the surface and that formed by deposition of intermediate silylene are discriminately shown in FIG. 24. FIG. 24(a) relates to a case of less silylene in the gas phase, where the film formation by feed gas monosilane takes place predominantly, whereas the film formation by intermediate silylene takes place much less, resulting in a good step coverage. In case of FIG. 24(b) of more silylene, the film formation by feed gas monosilane takes place much less, whereas the film formation by intermediate silylene takes place predominantly, so that the film thickness around the hole openings becomes larger, whereas the film thickness at the inside of the hole becomes smaller, resulting in lowering of the step coverage. That is, to improve the step coverage, the formation rate of an intermediate must be reduced.

The higher the gas temperature, or the broader the gas high temperature zone, or the higher the pressure, the more easily the intermediate can be formed. The formation rate of the intermediate is more influenced by temperature than to pressure. Thus, as disclosed in JP-A-10-74703, it is also possible to increase the step coverage by elevating the pressure, so long as the wafer temperature is lower.

However, the step coverage attainable by such a method has a limit, resulting in a failure to satisfy such requirements as made by the present inventors, as already mentioned above.

Particularly in these years, the aspect ratio of hole or trench to be filled has been higher and higher and doping with an impurity such as phosphorus, etc. at a higher concentration ($>1\times10^{20}$ atoms/cm$^3$) has been in demand, while a much higher film-forming rate has been required. Thus, said limit to the step coverage has been a more and more important problem. A process and an apparatus for producing a CVD film with a distinguished step coverage at a high film-forming rate even against a high aspect ratio and a high impurity concentration uniformly with a good reproducibility have been desired in these situations.

The present invention has been established to solve the aforementioned problems. A first object of the present invention is to provide a process for producing a semiconductor with improved step coverage, film-forming rate, uniformity of film-forming rate in the in-plane region of a wafer (uniformity of temperature in the in-plane region of the wafer during the film formation and film-forming reproducibility at every wafers (temperature reproducibility).

A second object of the present invention is to provide an apparatus for producing a semiconductor suitable for conducting the process for producing the semiconductor.

These objects can be attained by forming a film under suitable pressure capable of attaining a desired film-forming rate while narrowing a gas phase zone were the gas is heated to high temperatures to control the formation rate of the intermediate.

For example, these objects can be attained in the film-forming step by placing a wafer on a susceptor provided in a treating chamber under pressure kept to 1,000–50,000 Pa, maintaining a susceptor temperature at 500° C. or higher and supplying a feed gas under silicon-containing gas partial pressure of 200–5,000 Pa into the treating chamber from a position by 1–20 mm high above the wafer at a flow rate of 500–50,000 sccm.

The feed gas flow rate may be expressed by 0.7–80 sccm/cm$^2$, a quotient of feed gas flow rate divided by wafer area on which a film is to deposit.

Since the feed gas is supplied at a high flow rate from a shower plate so as to be injected onto the wafer in the present process, the high temperature zone in the gas phase can be narrowed to control formation of the intermediate, thereby improving the step coverage. Furthermore, the necessary film-forming rate can be obtained by controlling the pressure during the film formation.

BRIEF DESCRIPTION OF DRAWINGS

FIG. 7 shows relations between the size of gas injection zone from shower plate and high temperature zone.

FIG. 8 is a graph showing heat conductance of $SiH_4$.

BEST MODE FOR CARRYING OUT THE INVENTION

Figure 1:
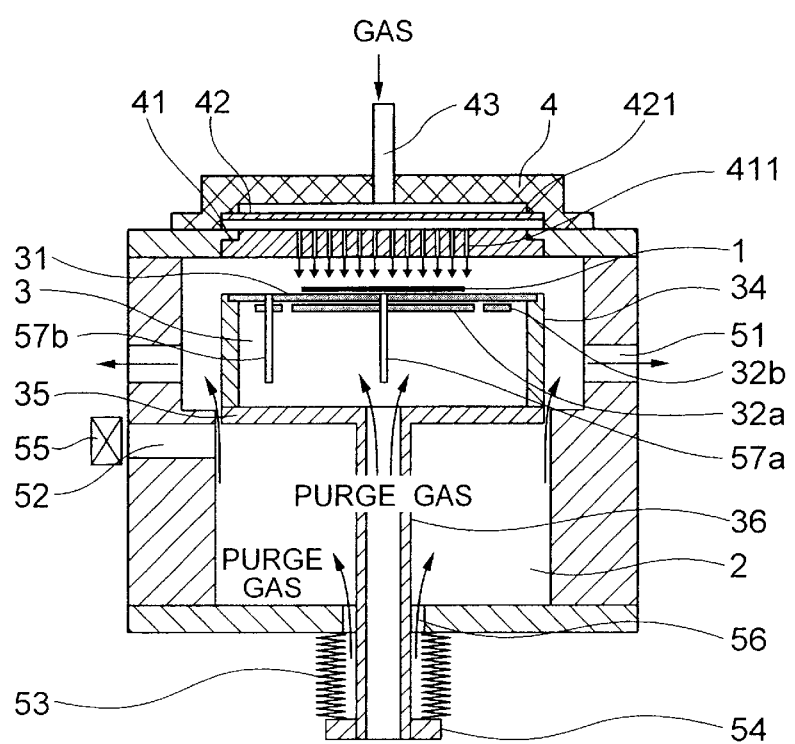
FIG. 1 is a cross-sectional view of the treating chamber of a CVD apparatus suitably applicable to a first embodiment of the present invention.

FIG. 1 is a view showing the cross-section of the treating chamber of a CVD apparatus suitably applicable to a first embodiment of the present invention. In treating chamber 2, vertically movable heating stage 3 is provided and gas supply section 4 for introducing a gas is mounted on the top of the treating chamber. Exhaust gas outlet 51 and transporting port 52 for wafer 1 are provided on the side of the treating chamber. Gate valve 55 is provided at the outside of transporting port 52 to isolate treating chamber 2 from the surrounding atmosphere. Pressure control valve and vacuum pump (not shown in the drawing) are connected to exhaust gas outlet 51 to adjust the pressure in treating chamber 2 to 1,000–50,000 Pa.

Heating stage 3 comprises, from the top downwards, disk-shaped susceptor 31, disk-shaped heater 32, disk-shaped and cylindrical reflector plates 33, cylindrical side wall 34 and disk-shaped bottom plate 35, and hollow shaft 36 is provided at the center of bottom plate so as to communicate with the inside of heating stage 3.

Susceptor 31 is composed of heat-resistant ceramico, a few-about 10 mm thick, and coated to protect the surface, depending on the species of gas to be passed into treating chamber 2. Coating may be carried out to change the emissivity of susceptor 31. In the case, it is necessary that the mounted region and the unmounted region of the susceptor by wafer 1 have different emissivities. Usually, the emissivity of unmounted peripheral surface region of the susceptor, by wafer 1 is made to decrease to reduce the heat radiation rate, thereby making the temperature in the peripheral region of susceptor 1 higher than at the center. Heater 32 is provided below susceptor 31 while keeping it at a distance of 1–30 mm from susceptor 31 and substantially in parallel thereto. Heater 31 is about a few mm thick and is divided in a plurality of zones (in this embodiment two zones, i.e. central zone 32a and peripheral zone 32b), and heat generation rates of individual zones can be independently controlled so that thermocouples 57a and 57b fixed to susceptor 31 can reach predetermined temperature, respectively. Heat is transferred from heaters 32a and 32b to susceptor 31 by radiation and gas conduction. The narrower the distance between heater 32 and susceptor 31 or the higher the pressure in heating stage 3, the higher the heat transfer rate by gas conduction, resulting in efficient heating. If the distance between heater 32 and susceptor 31 is made too narrow, the heat transfer rate, will be largely changed in spite of even a small change in the distance, and thus a preferable distance is at least 1 mm. If the distance between heater 32 and susceptor 31 is made too broad, on the other hand, heat is transferred also to the center of susceptor 31 by radiation even by increasing the heat generation rate of peripheral heater 32b to elevate the peripheral temperature of susceptor 31, and thus no appropriate temperature distribution can be obtained. Preferable distance between heater 32 and susceptor 31 is maximum about 30 mm.

The lower part of shaft 36 is projected to the outside of treating chamber 2 through opening 56 provided at the bottom of treating chamber 2, and flange 54 is fixed to the lower end of the shaft. Flange 54 is connected to the bottom of treating chamber 2 through expandable bellows 53 to isolate the inside of treating chamber 2 from the surrounding atmosphere. Flange 54 is fixed to a moving mechanism (not shown in the drawing) so that heating stage 3 can be vertically moved. An inert gas is introduced into the inside of heating stage 3 through shaft 36 to maintain a little higher pressure in heating stage 3 than in treating chamber 2, thereby preventing the feed gas introduced into treating chamber 2 from flowing into the inside of heating stage 3. An inert gas is introduced into treating chamber 2 also from the clearance between shaft 36 and opening 56 to prevent deposition of undesired film on the wall surface particularly at the lower half part of treating chamber 2.

Gas supply section 4 comprises shower plate 41, dispersion plate 42 and inlet 43, and a feed gas is introduced through inlet 43 at 500–50,000 sccm (which is an abbreviated form of standard cubic centimeter per minute, i.e. volumic flow rate per minute, as measured in the standard state) and supplied to wafer 1 through dispersion plate 42 and shower plate 41. Shower plate 41 is arranged substantially in parallel with the film-forming plane of wafer 1.

In this embodiment, dispersion sheet 41 is shown as one plate, but a plurality of dispersion sheet 42 may be required in some cases, depending on flow rate and pressure, or no dispersion sheet may be required on the contrary. A large number of gas injection nozzles 421 and 411 are provided in the central regions of dispersion plate 42 and shower plate 41, respectively. Shower plate 41 is heated by the heat from wafer 1 and susceptor 31, resulting in temperature elevation, and thus shower plate 41 is cooled by a cooling mechanical (not shown in the drawing). Or, by making shower plate 41 from a material with a high heat conductivity and also by making it thicker at the same time, heat can be radiated toward the surroundings through conduction of shower plate 41 itself. In that cases, materials and thickness must be selected to that the product of heat conductivity of a material multiplied by thickness of shower plate 41 may be 1 W/K or more, preferably 5 W/K or more. To increase the heat conductance from shower plate 41 toward the upper wall surface of treating chamber 2, shower plate 41 must be firmly fixed to the upper wall surface of treating chamber 2 by bolts, etc. (not shown in the drawing). In this manner, the temperature of shower plate 41 is prevented from higher temperature elevation than as desired (for example, 200° C. or lower).

Figure 2:
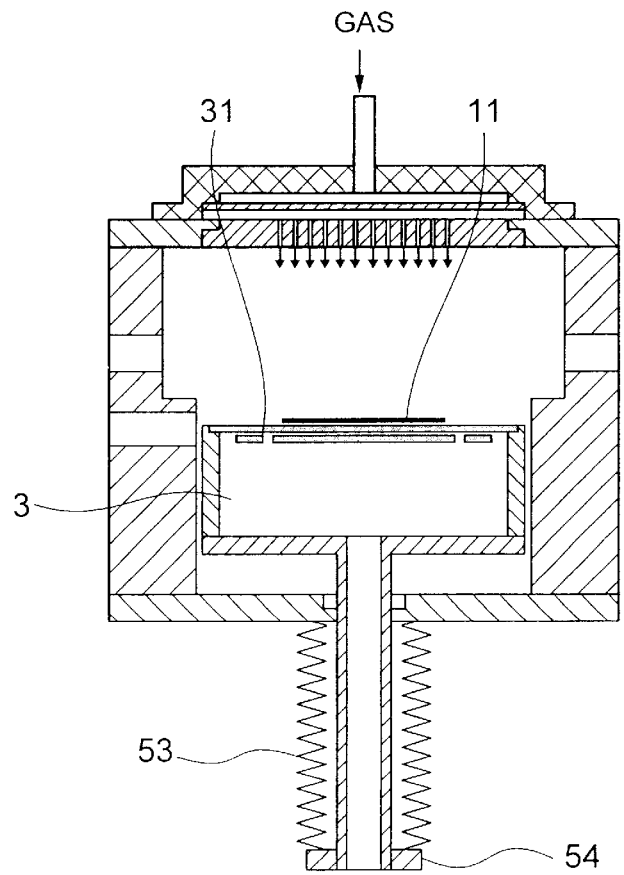
FIG. 2 is a cross-sectional view of the treating chamber of a CVD apparatus suitably applicable to the first embodiment of the present invention.

Description will be made below of a treating procedure for wafer 1. Before wafer 1 is introduced into treating chamber 2, heating stage 3 is set to film-forming position as shown in FIG. 1 and heaters 32a and 32b are made to generate heat in advance, so that susceptor 31 (thermocouples 57a and 57b) may be heated to a predetermined temperature. At the same time, an inert gas such as $N_2$, etc. is introduced through inlet 43 so that the pressure in treating chamber 2 may be substantially equal to that during the film formation and supplied into treating chamber 2 through dispersion plate 42 and shower plate 41. Then, heating stage 3 is lowered to the position as shown in FIG. 2. In that state, wafer 1 placed on a transport jig (not shown in the drawing) is transported into treating chamber 52 through transporting port 52, and then wafer 1 is transferred onto heating stage 3 by a mounting mechanism (not shown in the drawing). Then, heating stage 3 is elevated to the film-forming position and wafer 1 placed on susceptor 31 is heated at that position by susceptor 31 kept at elevated temperatures. Wafer 1 is kept standing until it reaches a predetermined temperature (550°–650° C. In case of phosphorus-doped silicon film) and then a feed gas ($SiH_4$, $PH_3$ and $H_2$ in case of phosphorus-doped silicon film) is introduced through inlet 43 at the top at a flow rate of 500–50,000 sccm in total in place of the inert gas and supplied to be injected onto wafer 1 through desperation plate 42 and shower plate 41. This gas flow rate is suitable for forming a wafer on a wafer, 300 mm in diameter, but when the wafer has a different diameter, the flow rate must be changed from 0.7 sccm/cm$^2$ to 80 sccm/cm$^2$ (quotient of flow rate divided by wafer area) per unit as a standard, depending upon wafer area. The gas from shower plate 41 is injected onto wafer 1 and the flow direction is thereby changed. Then the gas flows substantially in parallel with wafer 1 and is vented through the exhaust gas outlet provided on the side wall of treating chamber 2. Pressure (total pressure) in treating chamber 2 is controlled to a predetermined one in a range of 1,000–50,000 Pa by a pressure control valve (not shown in the drawing) and the flow rate is controlled so that the partial pressure of silicon-containing gas (for example, $SiH_4$) may be 200–5,000 Pa. When a film of desired thickness is deposited, introduction of the feed gas is discontinued, and the inert gas is supplied again through shower plate 41. After the gas in treating chamber 2 is replaced with the inert gas, wafer 1 is taken out through transporting port 52 in the reversed manner of the introduction. At every time or in an appropriate period after the film formation on wafer 1, an etching gas is introduced into treating chamber 2 to remove undesired films deposited on wall surfaces of treating chamber 2, particularly on the surface of susceptor 31.

Reasons why it is possible to attain a high step coverage and a high film-forming rate simultaneously by conducting film formation in such a manner as above will be explained below, referring to the drawings.

Figure 3:
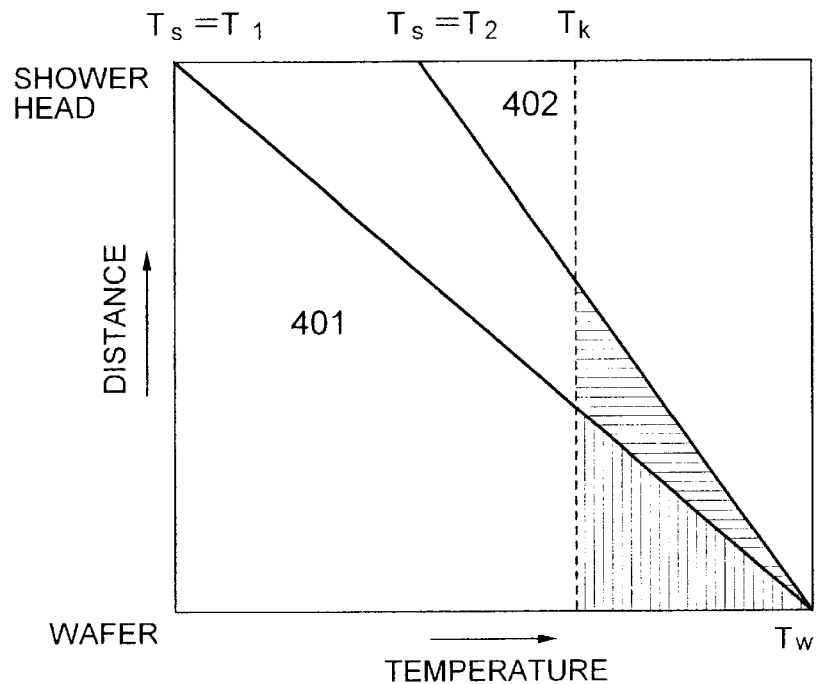
FIG. 3 is a graph showing an influence of shower plate temperature on gas temperature distribution.

FIG. 3 shows gas temperature distribution between wafer 1 and shower plate 41, when temperature Ts of shower plate 41 is changed. The graph shows temperature distribution on the assumption that there is no flow between shower plate 1 and wafer 1 and heat is transferred from wafer 1 to shower plate 41 only by conduction by gas. Gas temperature linearly decreases in the direction from wafer 1 toward shower plate 41 FIG. 3 shows that in the case of lower temperature of shower plate (Ts=T1), as compared with the case of higher temperature of shower plate 41 (Ts=T2), the high temperature zone is narrowed, resulting in less formation of an intermediate. In FIG. 3, Tk is a temperature at or below which no gas phase reaction occurs (or such occurrence is substantially negligible).

Figure 4:
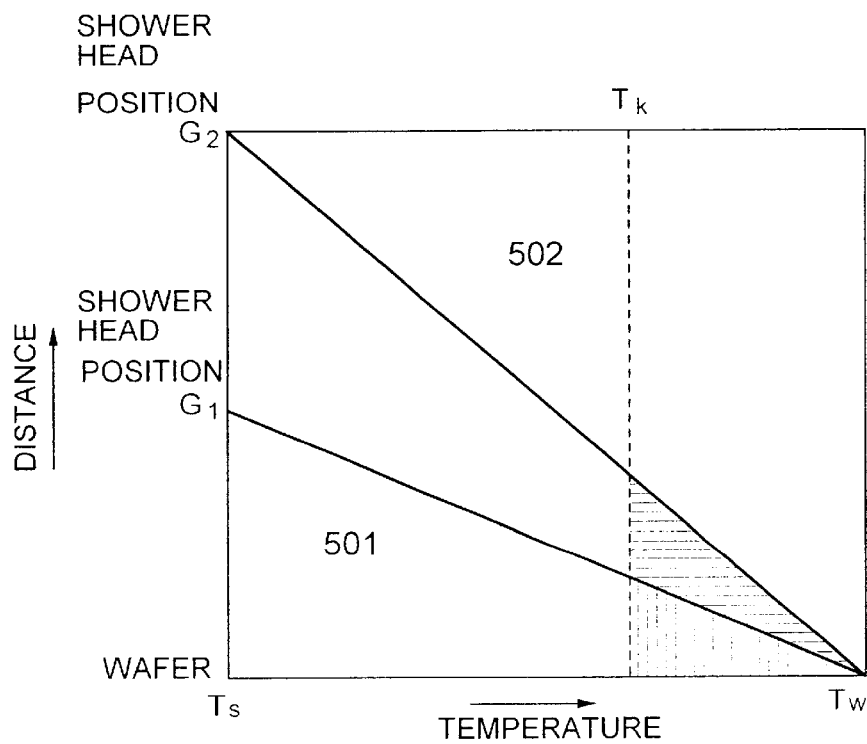
FIG. 4 is a graph showing an influence of a distance between shower plate and wafer upon gas temperature distribution.

FIG. 4 shows gas temperature distribution between wafer 1 and shower plate 41 when the distance between wafer 1 and shower plate 41 is changed, where the same assumption is made that there is no flow between wafer 1 and shower plate 41 and heat is transferred only by conduction by gas FIG. 4 shows that in the case of narrower distance ($G_1$), as compared with the case of broader distance ($G_2$) between wafer 1 and shower plate 41, the high temperature zone is narrowed, resulting in less formation of the intermediate.

As explained above, to narrow the high temperature zone, thereby controlling the gas phase reaction, it is necessary to set a gas temperature gradient between shower plate 41 and wafer 1 to a predetermined value or higher. Let a difference between temperature Tw of wafer 1 and temperature Ts of shower plate 41 be ΔT and let a distance therebetween be G. Then, a gas temperature gradient will be given by ΔT/G. When a value of ΔT/G is set to about 20° C./mm or more, lowering of the step coverage by the intermediate formed by gas phase reaction can be controlled to a negligible range. To set the gas temperature gradient ΔT/G to 500° C./mm or more, on the other hand, it is necessary to cool shower plate 41 to a lower temperature than room temperature or make the distance between wafer 1 and shower plate 41 to be 1 mm or less. Problems in case that the distance between wafer 1 and shower plate 41 is made to be 1 mm or less has been already explained. Cooling of shower plate 41 to a lower temperature than room temperature involves such a disadvantage as a necessity for a large cooling mechanism in a complicated structure. Thus, AT/G is desirably between 20° C./mm and 500° C./mm.

Figure 5A:
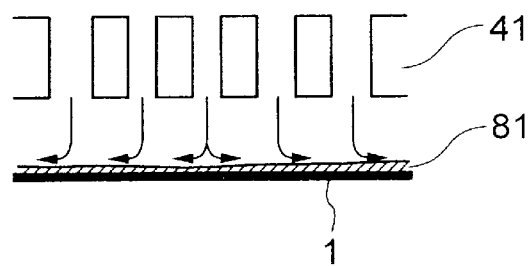
FIG. 5 schematically show influences of gas flow rate and gas feed direction on gas temperature distribution.
Figure 5B:
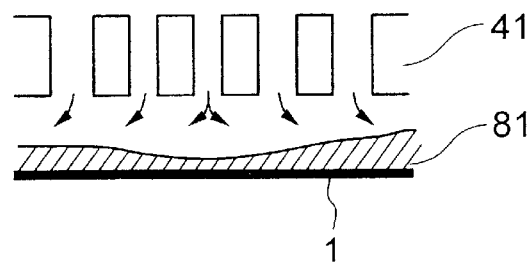
Figure 5C:
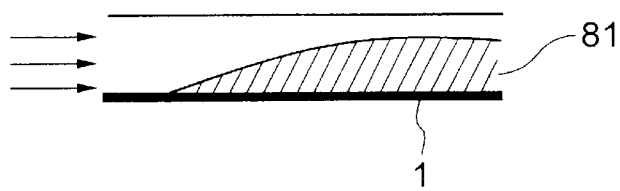
Figure 6:
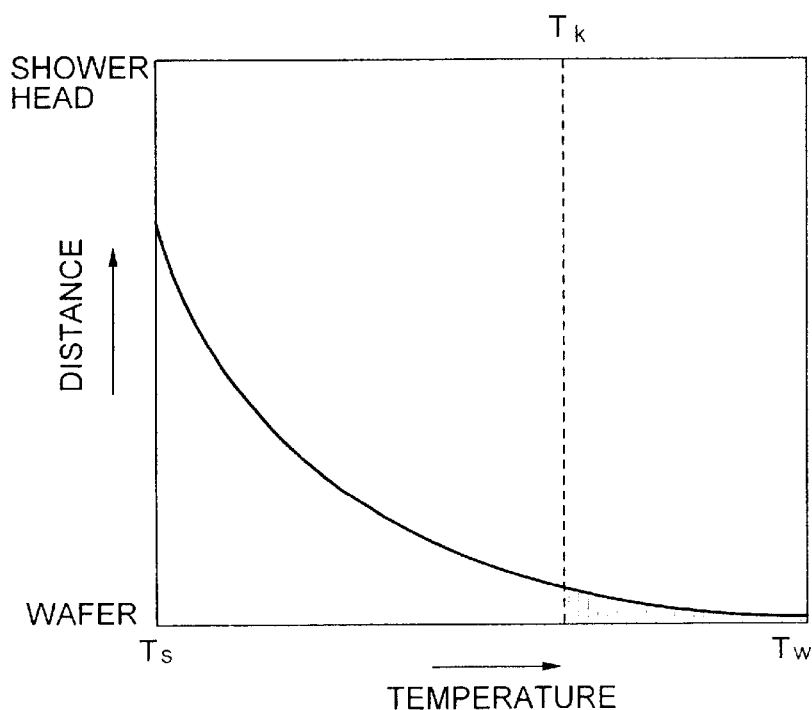
FIG. 6 is a graph showing gas temperature distribution when gas is vertically injected to wafer.

FIG. 5 shows stages of high temperature zone formed over wafer 1 when gas flow rate and gas supply direction are changed. (a) shows the case that the gas is supplied from shower plate 41 at a high flow rate, (b) shows the case that the gas is supplied from shower plate 41 at a low flow rate and (c) shows the case that the gas as in (a) is supplied in a parallel direction to wafer 1 at the same high flow rate, where wafer 1 and shower plate 41 have the same temperature in all these cases. When the gas is supplied in a parallel direction to wafer 1 as in (c), high temperature zone 81 is gradually extended from the left end of the wafer at which the gas is introduced. In case of (b), the gas is supplied from shower plate 41 at a low flow rate with a low flow velocity in the vertical direction toward wafer 1, so that high temperature zone 81 as broad as that of (c) can be formed. In case of (a), which simulates the present invention, on the other hand, the gas is supplied from shower plate 41 at a high flow rate, so that the gas flow velocity in the vertical direction toward wafer 1 becomes higher and high temperature zone 81 is not developed, but is becoming narrower, whereby formation of the intermediate can be controlled. Temperature distribution between wafer 1 and shower plate 41 in case of (a) is shown in FIG. 6, from which it is apparent that the high temperature zone can be narrowed by passing the gas at a high flow rate, as compared with the case that there is no gas flow as shown in FIG. 3.

The gas supplied near the center of wafer 1 flows toward the peripheral region while becoming warmer over wafer 1, and thus, even if the high temperature zone is uniform within the in-plane region of the wafer, the amount of formed intermediate will increase as the gas approaches the peripheral region. However, if the gas flow rate is high as in (a), the flow velocity in the parallel direction to the wafer will increase, so that the necessary time for the gas supplied near the center to flow out of the edge of wafer 1 outwards will be shorter and the amount of formed intermediate will be decreases in the peripheral region, thereby effectively improving the step coverage within the in-plane region of wafer 1 and the uniformity of film-forming rate. Furthermore, it is known that $PH_3$ as a doping gas also undergoes such reactions that intermediates formed therefrom by gas phase decomposition such as pH, etc. are taken into a depositing film, and the uniformity in the in-plane region of wafer 1 and the uniformity of sheet resistance can be improved by similar mechanism to that as with monosilane.

FIG. 7 shows relations between the size of region in which gas injection nozzles 411 are provided and the extension of high temperature zone formed in the gas phase, where (a), (b) and (c) show a case that the region in which gas injection nozzles 411 are provided is large than the diameter of wafer, a case that the region is smaller than the diameter of wafer 1, and a case that the region is approximately equal to the diameter of wafer 1, respectively, and the gas flows at the same flow rate in all these cases. In case of (a), the region in which gas injection nozzles 411 are provided is larger than wafer 1, so that the gas flow velocity in the vertical direction becomes lower than that as in (b) or (c) and high temperature zone 81 over wafer 1 becomes broader. If it is tried to narrow the high temperature zone by such shower plate 41, the gas flow rate is inevitably more increased, becoming uneconomical. In case of (b), the region in which gas injection nozzles 411 is provided is smaller than wafer 1 and the gas flow velocity in the vertical direction is higher, so that the high temperature zone will be narrow in the region provided with gas injection nozzles 411, but high temperature zone 81 will be expanded as the gas flows in the parallel direction to and along wafer 1. In case of (c), gas injection nozzles 411 are provided in a circular region having approximately the same diameter as that of wafer 1 so as to cover wafer 1 entirely, so that the gas flow velocity in the vertical direction and the parallel direction to wafer 1 will be higher over the wafer than that as in (a). Due to the higher flow velocity in the vertical direction, high temperature zone 81 becomes narrower over the entire surface of wafer 1 and thus the amount of formed intermediate will be reduced. By providing gas injection nozzles 411 only in the circular region having approximately the same diameter as that of the wafer at the center of shower plate 41 in this manner, the high temperature zone can be narrowed over wafer 1 without any loss of gas and formation of the intermediate can be controlled. Case that the gas flow rate per unit area is approximately the same at any positions throughout the gas injection region has been shown in (c), but the gas flow rate may be distributed. Even if the thickness of high temperature zone is uniform over wafer 1, the intermediate will be richer nearer to the periphery, as already explained before. To prevent it, the gas flow rate per unit area must be higher nearer to the periphery of shower plate 41, thereby increasing the gas flow velocity in the vertical direction and making the high temperature zone thinner nearer to the periphery, whereby the amount of formed intermediate can be made uniform over the surface of wafer 1.

Accordingly, by (a) maintaining shower plate 41 at a temperature of 200° C. or lower, (2) making a distance between shower plate 41 and wafer 1 as narrow as 1–20 mm, (3) introducing a large amount of a gas, for example, at a flow rate of 500–50,000 sccm (0.7–80 sccm/cm$^2$ in terms of a quotient of it divided by wafer area) from shower plate 41, and (4) providing gas injection nozzles 411 only in a circular region having approximately the same diameter as that of wafer 1 approximately at the center of the shower plate, the high temperature zone in the gas phase can be narrowed, formation of the intermediate can be controlled and the step coverage can be drastically improved.

On the other hand, distribution of the intermediate can be made more uniform within the in-plane region of wafer 1, and the step coverage, the film-forming rate and the uniformity of sheet resistance within the in-plane region of wafer 1 can be improved.

Narrowing of the high temperature zone (i.e. temperature boundary layer) in the gas phase to control formation of the intermediate means depriving wafer 1 of heat by the gas, resulting in being much more cooled. This is true not only of wafer 1, but also of the peripheral region of susceptor 31 not covered by wafer 1. That is, the peripheral region of susceptor 31 will undergo temperature lowering and thus the temperature uniformity of wafer 1 becomes hard to maintain. Even if a cover is provided in the peripheral region of susceptor 31, cooling will take place likewise, though cooling would take place to some degree. In this embodiment, plate-shaped heaters 32a and 32b, divided into a plurality of zones, are provided near susceptor 31 to solve said problem, whereby the heating rate can be increased only in the peripheral region to prevent deterioration of temperature uniformity of water 1 to a minimum. Since susceptor 31 is as thin as a few-tens mm, the temperature in the central region can be prevented from becoming unnecessarily higher by heat conduction through susceptor 31.

Accordingly, if the high temperature zone can be narrowed, the amount of formed intermediate can be made less but the step coverage can be hardly lowered even by increasing the pressure. Since the film-forming rate is proportional to a partial pressure of silicon-containing gas, the film-forming rate can be increased while maintaining a desired step coverage. For example, in case of depositing a phosphorus-doped silicon film using $SiH_4$, $PH_3$ and $H_2$ as a feed gas, a very high step coverage, e.g. 97–99%, can be obtained at a film-forming rate of 100 mm/min or less.

Description will be made below of a second embodiment of the present invention, which is directed to solving a problem of deterioration of temperature uniformity of wafer 1 when pressure is increased to improve the film-forming rate, because the heat conduction by gas becomes predominant in the heat transfer process from susceptor 31 to wafer 1, thereby increasing the warping of wafer 1.

Description will be made in detail below of the problem. Heat is transferred from susceptor 31 to wafer 1 by radiation and conduction by gas. Radiation heat flux from susceptor 31 to wafer 1 can be obtained y an equation of radiation heat transfer between parallel planes, and radiation heat conductance Cr can be expressed as follows:

$Cr = \sigma(T_1^3 + T_1^2 T_2 + T_1 T_2^2 + T_2^3)/(1/\epsilon_1 + 1/_2 - 1)$ $\sigma$ stefan-Boltzmann constant $= 5.67 \times 10^{-8}$ $T_1$ Temperature at plane 1 (susceptor 31)

$T_2$ Temperature at plane 2 (wafer 1)

$\epsilon_1$ Emissivity at plane 1 (susceptor 31)

$\epsilon_2$ Emissivity at plane 2 (wafer 1)

Radiation heat conductance at $T_1 = 1,00K$, $T_2 = 900K$, $\epsilon_1 = 0.9$ and $\epsilon_2 = 0.7$ will be Cr = 126.6 (W/m²k) On the other hand, gas heat conductance Cg can be derived from an equation of gas heat conduction between parallel planes in the molecular/viscous flow and can be expressed as follows:

$Cg = \alpha \Lambda P/(\kappa + \alpha \Lambda hP)$ $\Lambda = (r+1)/2(r-1)(R/2\pi MT)^{0.5}$ $\alpha$ Gas accommodation coefficient $\Lambda$ Heat conductivity of gas free molecules (W/m²kPa)

$\lambda$ Gas heat conductivity (W/mk)

h Distance (m) between susceptor 31 and wafer 1

P Pressure (Pa)

r Specific heat ratio

R Gas constant (J/kmol k)

M Molecular weight of gas (g/mol)

T Gas temperature (k)

FIG. 8 is a graph showing results of calculating heat conductance of $SiH_4$ on the assumption of $\alpha=1$, where the axis of abscissa shows a distance h between wafer 1 and susceptor 31 and the axis of ordinate shows a heat conductance Cg (particularly in case of unclean surface, $\alpha$ will be about 0.3 —about 0.8, and thus the calculation is based on estimation that Cg is high). As shown in graph, heat conductance Cg is substantially constant under pressure of about 100 Pa, even if the distance h is changed, and is in a range of Cg=200–300 (W/m²K), which is substantially equal to the radiation heat conductance Cr. Thus, even if h is not uniform within the in-plane region of wafer 1, heat transfer rate is not largely changed within the in-plane region of wafer 1. However, if the pressure is 1,000 Pa or higher, the heat conductance Cg is largely changed by distance h, and at h=10–200 $\mu$m Cg will be 400–5,000 (W/m²k). Since various kinds of films are formed on wafer 1, it is usually difficult to eliminate warping (a few tens-hundred $\mu$m). Thus, heat transfer rate from susceptor 31 to wafer 1 is changed by differences in distance h from one position to another within the in-plane region of wafer 1, thereby making the temperature not uniform. Since the warping degree is not always constant at every wafer 1, the average temperature is also changed.

Figure 9:
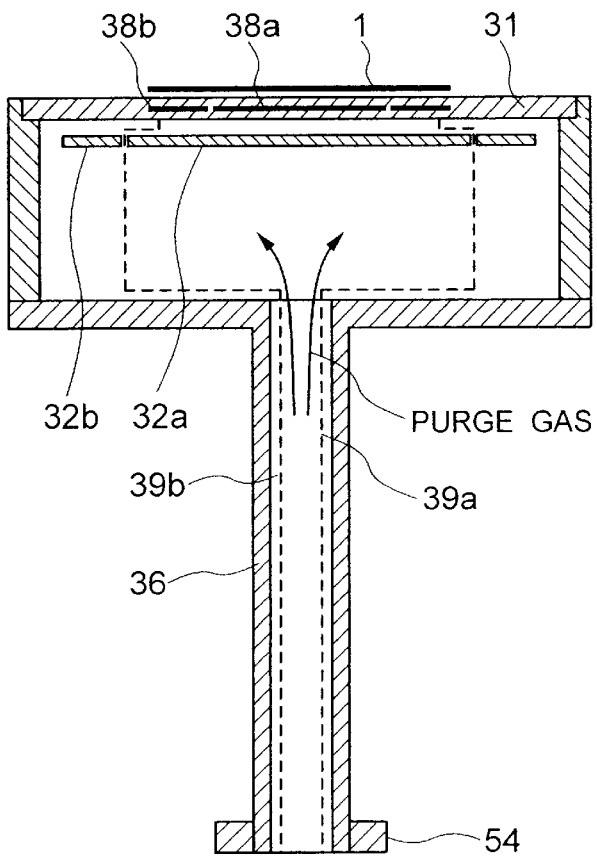
FIG. 9 is a cross-sectional view of a heating stage suitably applicable to a second embodiment of the present invention.
Figure 10:
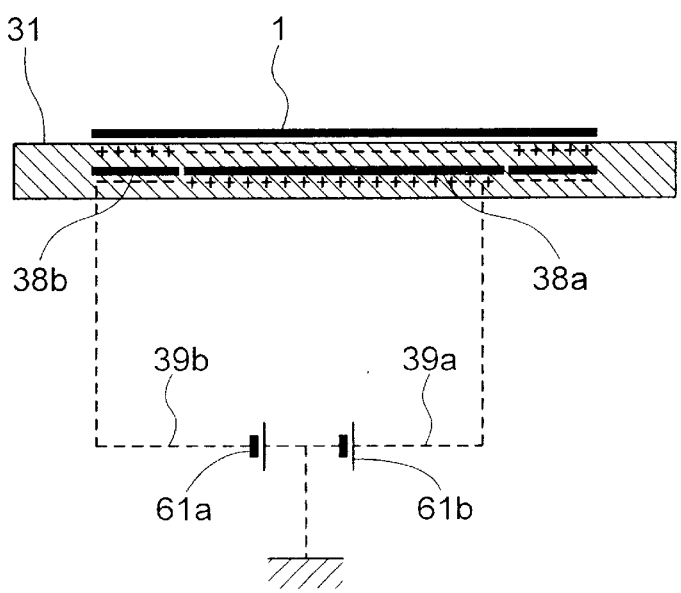
FIG. 10 is a schematic view showing a mode of wafer secured on susceptor by electrostatic force.
Figure 11:
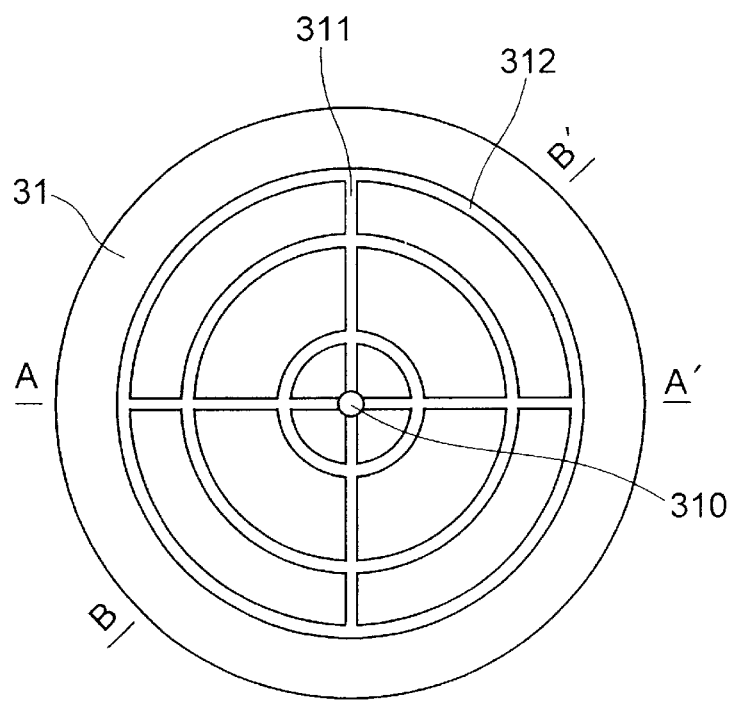
FIG. 11 is a view showing the shape of susceptor surface suitably applicable to the second embodiment of the present invention.
Figure 12:
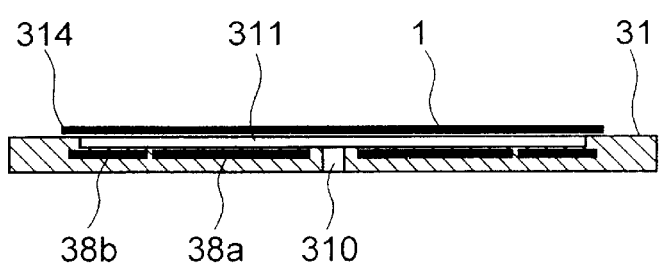
FIG. 12 is a cross-sectional view (along A–A' of FIG. 14) of a susceptor suitably applicable to the second embodiment of the present invention.
Figure 13:
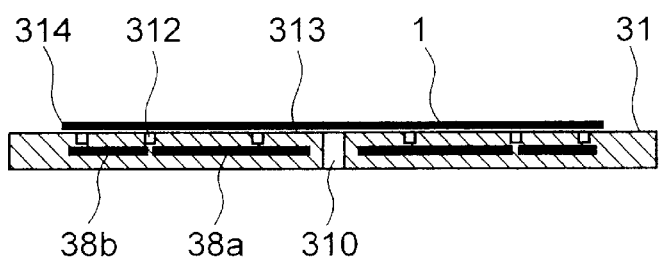
FIG. 13 is a cross-sectional view (along B–B' of FIG. 14) of a susceptor suitably applicable to the second embodiment of the present invention.
Figure 14:
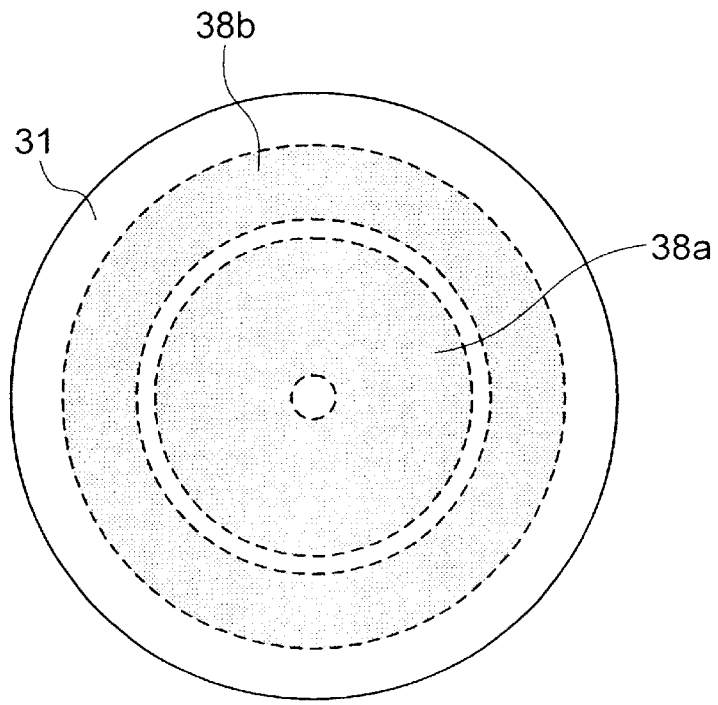
FIG. 14 is a view showing the shape of electrode provided in a susceptor suitably applicable to the second embodiment of the present invention.

To solve the problem, it is necessary to make a heat conductance from susceptor 31 to wafer 1 uniform in the in-plane region of wafer 1 and equal at every wafer 1. Thus, in the second embodiment, as in FIG. 9 (showing only heating stage 3), plate-shaped dielectric such as ceramic, etc. is used for susceptor 31, embedded with a plurality of electrodes 38a and 38b. Electrodes 38a and 38b are in an electrically insulated state by the dielectric, which constitute susceptor 31, and are connected to wiring 39a and 39b, respectively, for application of voltage. When wafer 1 is placed on susceptor 31 and a predetermined voltage is applied to between electrode 38a and electrode 38b, charging takes place as in FIG. 10 to secure wafer 1 onto the top surface of susceptor 31 by electrostatic force. By securing wafer 1 onto susceptor 31 by electrostatic force, distance h between wafer 1, even if warped, and susceptor 31 can be made forcedly uniform. Thus, heat transfer rate from susceptor 1 to wafer 1 can be made uniform in the in-plane region of wafer 1 and equal at every wafer 1, thereby improving temperature uniformity and temperature reproducibility of wafer 1. Furthermore, by supplying an inert gas such as He, $N_2$, Ar, etc. into between wafer 1 and susceptor 31 under a little higher pressure than in the treating chamber, the back side of wafer 1 can be prevented from deposition of undesired film. In that case, as shown in FIG. 11, radial gas grooves 311 are provided on the upside of susceptor 31, and gas grooves 312 connected thereto in the circumferential direction are provided thereon. FIGS. 12 and 13 are views showing a cross-section along A–A' and a cross-section along B–B' of FIG. 11, respectively. An inert gas is introduced into the space between wafer 1 and susceptor 31 through piping (not shown in the drawing) and gas inlet 310 provided at the center of susceptor 31, passes through individual gas grooves 311 and 312 and finally flows into treating chamber 2 through the clearance between wafer 1 and susceptor 31. At other parts 313 than gas grooves 311 and 312 wafer 1 and susceptor 31 are positioned face-to-face, while keeping a clearance of approximately surface roughness of susceptor 31 (about 10 $\mu$m) therebetween, and the inert gas flows therebetween. Also at outside 314 of the outermost circumferential gas groove, wafer 1 and susceptor 31 are positioned face-to-face while keeping a clearance of approximately surface roughness of susceptor 31 (about 10 $\mu$m) therebetween, and thus outside 314 plays a role of sealing to reduce as amount of inert gas leaking into treating chamber 2, whereby the pressure of inert gas can be made uniform within the in-plane region of wafer 1 and disuniformity of heat conductance, which occurs under relatively low pressure such as 5,000 Pa or lower, can be reduced. FIG. 14 shows shapes of electrodes 38a and 38b as viewed from the top of susceptor 31, where electrodes 38a and 38b are each in a ring shape with substantially equal area to each other. An inert gas is passed to between wafer 1 and susceptor 31, but the feed gas in treating chamber 2 cannot be completely prevented from deposition onto the back side of wafer 1 or the surface of susceptor 31. Film will deposit, though in a small amount, particularly on the surface of susceptor near the edge of wafer 1, but the film deposits only onto the peripheral edge of outer electrode 38b because of the ring shapes of electrodes 38a and 38b. Thus, even if the deposited film is conductive, no charge transfer will take place through the film, and the electrostatic force to attract wafer 1 to susceptor 31 is hardly lowered.

Figure 15:
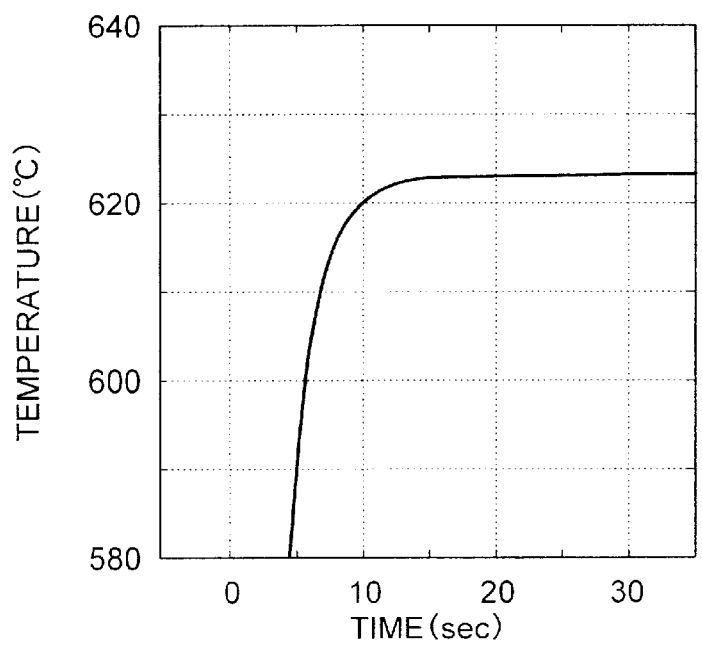
FIG. 15 is a graph showing changes in temperature of wafer secured on susceptor by electrostatic force in the second embodiment of the present invention.
Figure 16:
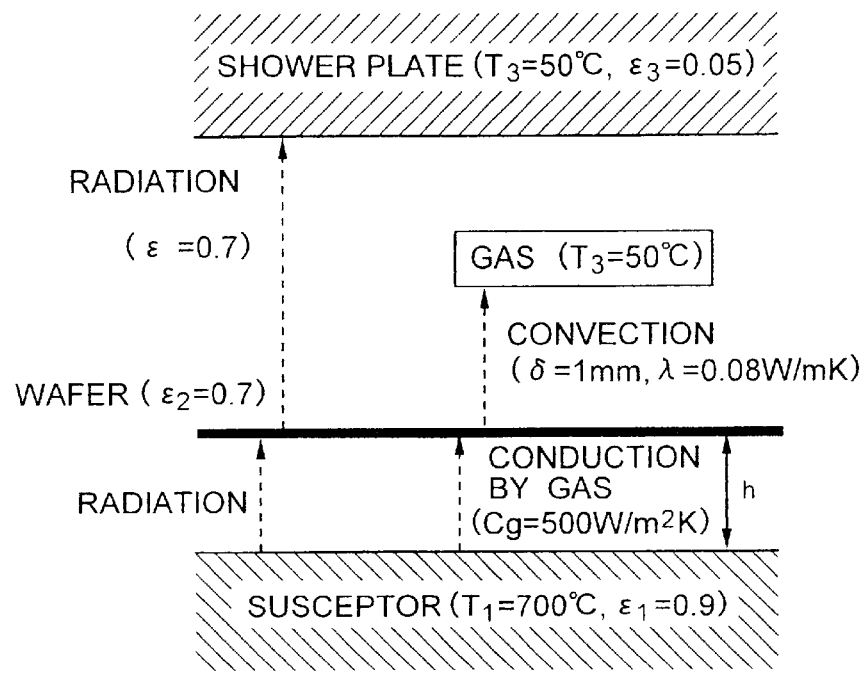
FIG. 16 shows a calculation model showing heat inflow and outflow into and from a wafer in the calculation of FIG. 15.
Figure 17:
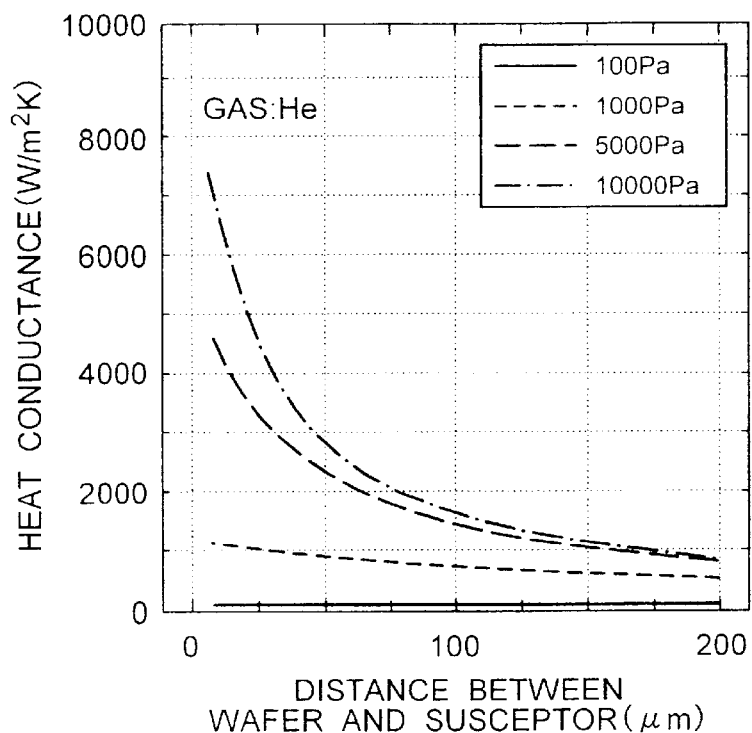
FIG. 17 is a graph showing heat conductance of He.
Figure 18:
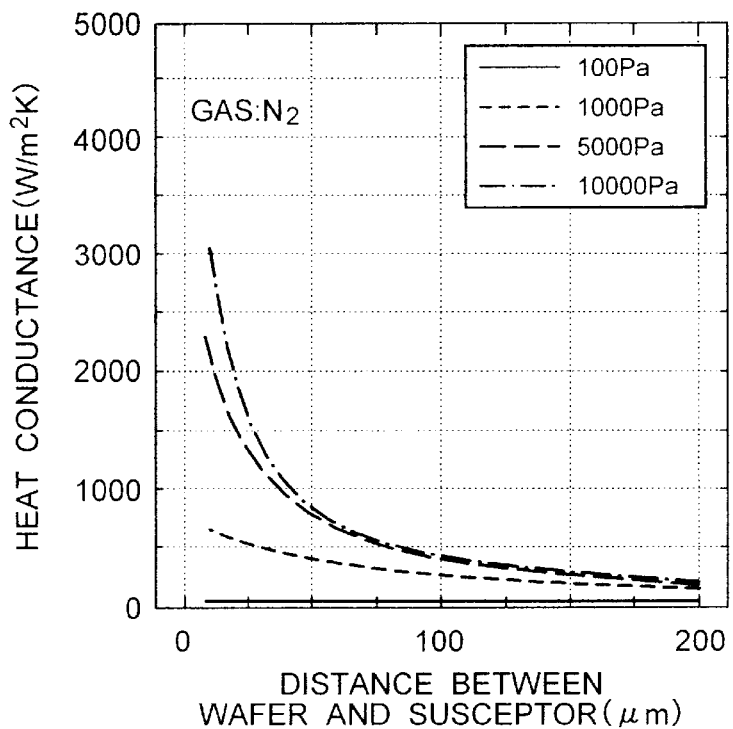
FIG. 18 is a graph showing heat conductance of $N_2$.

FIG. 15 is a graph showing changes in temperature of wafer 1 secured onto susceptor 31 by electrostatic force, which is a result of one-dimensional calculation of inflow and outflow of heat to and from wafer 1 by modelling as in FIG. 16. Calculation is based on the assumption that heat conductance from susceptor 31 to wafer 1 is Cg=500 (W/m²k), heat conductance from wafer 1 to feed gas is 80 (W/m²k), and the temperature of susceptor 31 is kept constant. It is apparatus from the result that temperature becomes constant for such a very short time as about 15 seconds after wafer 1 is secured onto susceptor 31 by electrostatic force (actually it takes a little more time, because the temperature of susceptor 31 is assumed to be constant). As shown in FIG. 17, when He is supplied to between wafer 1 and susceptor 31 as an inert gas, the condition for Cg=500 (W/m²k) can be fully attained even at h=100 μm because of a high heat conductivity of the gas itself. When $N_2$ is used on the other hand, h must be narrowed (e.g. $h=10^{-50}$ μm) according to a lower heat conductivity, as shown in FIG. 18. However, $N_2$ is so cheap that the production cost can be reduced. Only by communicating the inside of heating stage 21 with the space between wafer 1 and susceptor 31, $N_2$ supplied into heating stage 3 can be supplied to between wafer 1 and susceptor 31, thereby simplifying the gas system. The same effect as with N2 can be obtained likewise with Ar.

Figure 19:
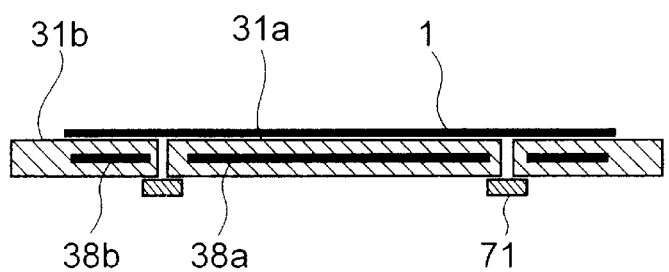
FIG. 19 is a view showing the shape of a susceptor suitably applicable to a third embodiment of the present invention.

Description will be made below of the structure of susceptor. FIG. 19 shows one example of susceptor 31, characterized in that susceptor 31 is radially divided. To make the temperature of wafer 1 uniform, it is necessary to elevate the temperature of susceptor 31 in the peripheral region of high heat radiation, thereby increasing a heat transfer rate to wafer 1. When the temperature in the peripheral region of susceptor 31 of integrated type is elevated, there is such a problem that the temperature in the central region will be elevated to a higher level by heat conduction through susceptor 31 than as desired. To prevent is, susceptor 31 is divided into a plurality of subdivisions, thereby reducing heat conduction through susceptor 31 and controlling undesired temperature elevation in the central region of susceptor 31, where susceptors 31a and 31b as a plurality of subdivisions are supported by holding rings 71. Thickness of individual susceptors 31a and 31b are so processed as to accord with one another in fluctuation of about 10 μm, whereby the upside on which wafer 1 is to be mounted can be made flat and the distance between susceptor 31 and wafer can be made uniform, thereby also making heat conductance by gas uniform. Or, a means of finely adjusting vertical positions of subdivisions of susceptor 31 individually (not shown in the drawing) may be provided.

Figure 20:
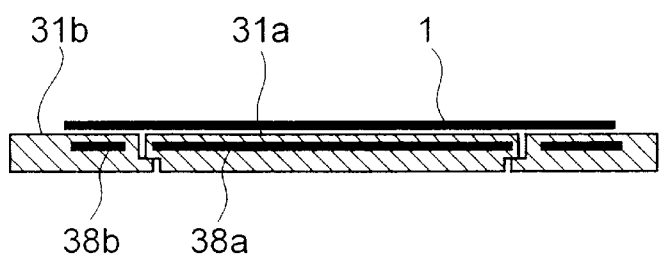
FIG. 20 is a view showing the shape of a susceptor suitably applicable to the third embodiment of the present invention.
Figure 21:
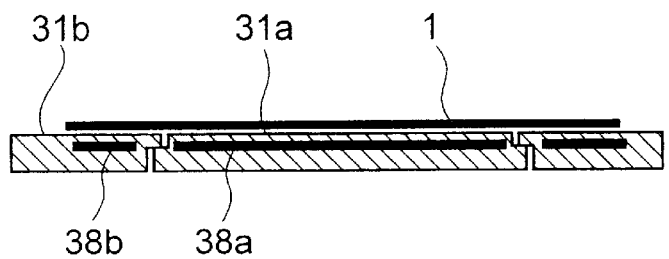
FIG. 21 is a view showing the shape of a susceptor according to an embodiment of the present invention.

FIGS. 20 and 21 are views showing different methods of supporting susceptors 31a and 31b as subdivisions. FIG. 20 shows an example of fixing outer susceptor 31b to heating stage 3 and engaging inner susceptor 31a thereon. FIG. 21 shows another example of fixing inner susceptor 31a to heating stage 3 and engaging outer susceptor 31b therewith in contrast to the above. In these examples, purge gas supplied into heating stage 3 is made to flow into treating chamber 2 through the clearances between susceptors 31a and 31b.

Furthermore, susceptors 31a and 31b as a plurality of subdivisions may be in a vertically movable structure so as to serve to transport wafer 1. In case of susceptor 3 shown in FIGS. 19 and 20, when heating stage 3 is moved down to the position shown in FIG. 2. inner susceptor 31a is made to project upwards from outer susceptor 31b. Then, wafer 1 transported into treating chamber 2 is placed on inner susceptor 31a, and after refraction of the transport jig (not shown in the drawing) heating stage 3 is elevated to a film-forming position (see FIG. 1) so that the distance between wafer 1 and shower plate 41 can be 1–20 mm. Then, voltage is applied to electrodes 38a and 38b in such a state that upsides of inner susceptor 31a and outer susceptor 31 are brought into alignment together to form a that plane, thereby securing wafer 1 onto susceptors 31a and 31b electrostatic force. After wafer 1 has reached a predetermined temperature, a film is made to deposit thereon.

Figure 22:
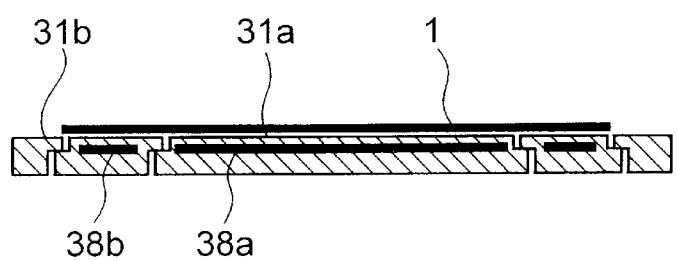
FIG. 22 is a view showing the shape of a susceptor suitably applicable to the third embodiment of the present invention.
Figure 23:
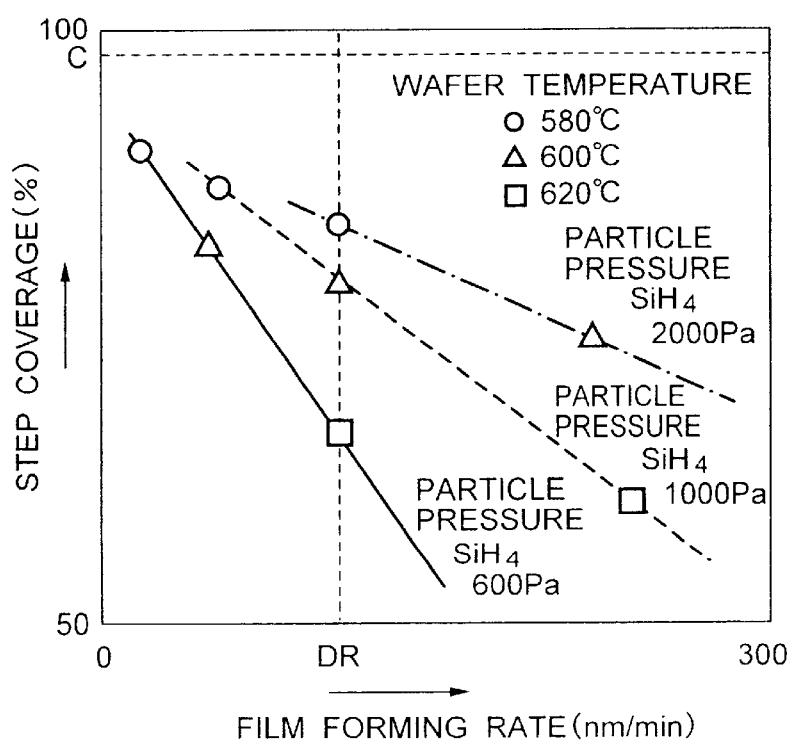
FIG. 23 is a graph showing relations between film-forming rate and step coverage according to the conventional film-forming process.
Figure 24A:
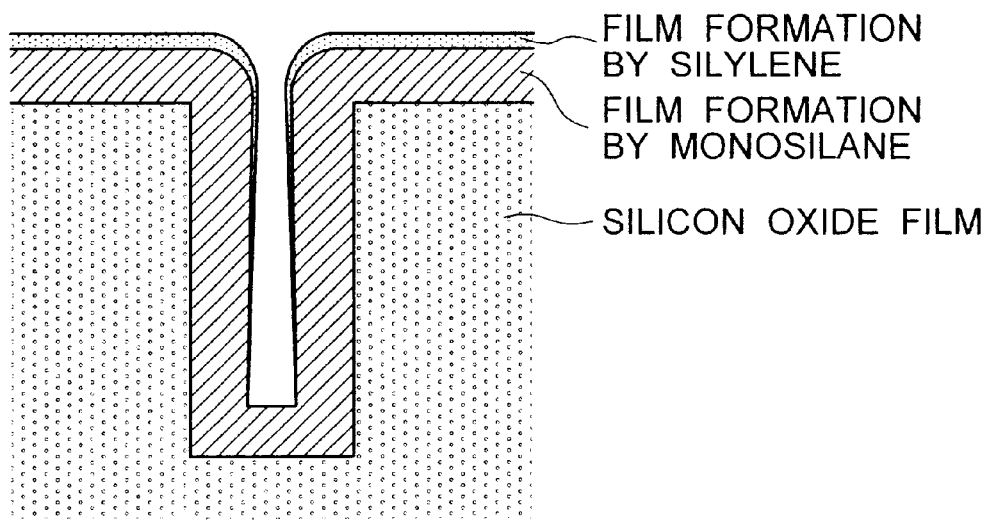
FIG. 24 illustrates influence of an intermediate on step coverage.
Figure 24B:
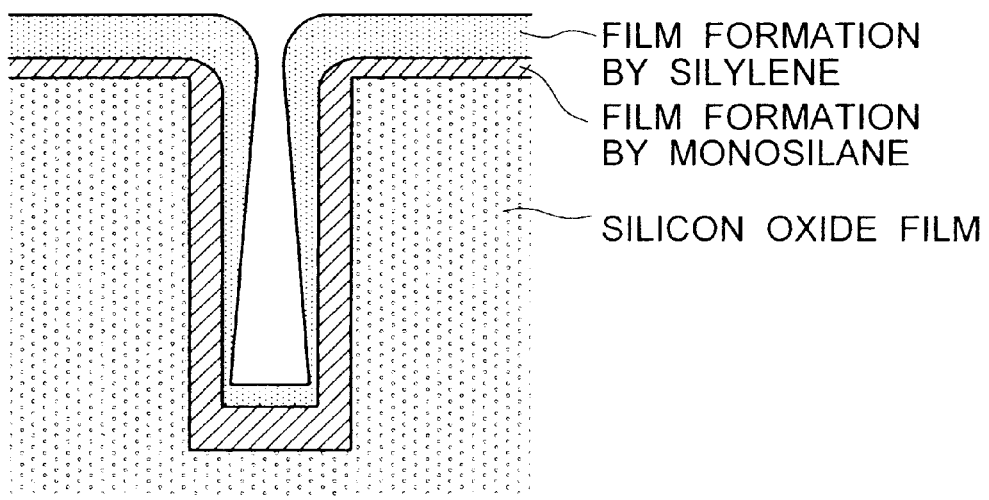

FIG. 22 shows another method of dividing the susceptor, where at the outside of susceptors 31a and 31b provided with electrodes 38a and 38b within, respectively, is further provided susceptor 31c provided with electrode within, and outer susceptor 31b provided with electrode 38b within is made smaller by about a few mm than the diameter of wafer 1, so that susceptor 31c may not be brought into direct contact with the back side of wafer 1 (by providing clearances of a few to a few hundred μm between susceptors). As in the aforementioned embodiment, purge gas supplied into heating stage 3 flows into treating chamber 2 through clearances between susceptors 31a, 31b and 31c. In this structure, no film is deposited on the surfaces of susceptors 31a and 31b, which secure wafer 1 by electrostatic force. Thus, fine particles can be prevented from generation due to sliding between the film and wafer 1 when wafer is to be mounted onto susceptor 31. When a conductive film is formed on the impurity-doped silicon film on the surface of outer susceptor 31b, the electrostatic force for securing wafer 1 becomes lower, but this problem can be solved by such a susceptor structure.

In the foregoing embodiments, an example of using $SiH_4$, $PH_3$ and $H_2$ as a feed gas is shown, but the feed gas should not be limited only to these. A case of using $Si_2H_6$ as other silicon-containing gas is particularly effective. Chlorine-containing gases such as $SiCl_2H$, $SiCl_3H$, $SiCl_4$, etc. are also effective in reactions to form $SiCl_2$, etc. with a high deposition probability. $N_2$ may be introduced in place of H2. Other phosphorus-containing gases than $PH_3$, and horon-containing or arsenic-containing gases may be introduced as a doping gas, or no doping gas may be introduced. Such gases as $NO_2$, $H_2O$, etc. may be introduced together with a silicon-containing gas to form a silicon nitride film or a silicon oxide film. Particularly, SiH4 or $Si_2H_6$ and $NO_2$ are effective for deposition of a silicon oxide film. In this case, a film can be formed with a distinguished step coverage and at a high film-forming rate by approaching cooled shower plate 41 to wafer 1, though temperature and pressure are to be changed, and injecting a large amount of gas through gas injection nozzles 411 provided in a circular region having substantially the same diameter with that of the wafer approximately at the center of the shower plate. Generally, application to a reaction system capable of forming intermediates with a higher deposition probability than that of the feed gas toward the wafer in a gas phase is more effective.

Lastly, brief comments will be made below of a well known reference relating to the present invention. Japanese Patent No. 2751015 discloses a process for depositing a uniform film on a wafer by supplying an oxygen gas containing monosilane and ozone from a cooled shower plate provided near the wafer face-to-face. The reference is identical with the present invention in the introduction of a gas from a shower plate provided near a wafer face-to-face, but differ from the present invention in the kind of feed gas and reaction mechanism, and fails to mention the object of the present invention, i.e. a high film-forming rate, a high step coverage, a good uniformity of film-forming rate and a good reproducibility, attained by injecting a large amount of feed gas onto wafer 1, thereby narrowing a high temperature zone and forming a film under relatively high pressure at the same time. Thus, it is apparent that no results of satisfying the high film-forming rate, high step coverage, good uniformity of film-forming rate and good reproducibility at the same time can be obtained in the reference.

According to the present invention, a CVD film with a high step coverage can be formed at a high film-forming rate. Furthermore, a CVD film can be formed with a good uniformity of film-forming rate in the in-plane region of a wafer, a good uniformity of film quality such as uniformity of sheet resistance and a good reproducibility at every wafers.

What is claimed is:

1. A process for producing a semiconductor, which comprises steps of:
    placing a wafer on a susceptor provided in a treating chamber,
    maintaining a susceptor temperature at 500° C. or higher, and
    supplying a feed gas together with a silicon containing gas from a shower plate toward the wafer into the treating chamber from a position 1–20 mm high above the the wafer, wherein the temperature of the shower plate is 200° C. or lower, and after the wafer is placed on the susceptor, the wafer is secured onto the susceptor by a force.

2. An apparatus for producing a semiconductor comprising a treating chamber, a pressure controlling device, a susceptor on which a wafer is to be mounted, having a plurality of electrodes so as to secure the wafer on the top surface of the susceptor, a heater provided below the susceptor, a shower plate provided at a distance of 1–20 mm from the position where the wafer is placed so as to supply a feed gas together with a silicon containing gas from the shower plate toward the wafer and provided with a plurality of gas injection nozzles, and a flow rate controller so as to control a flow rate of a silicon-containing gas.

3. An apparatus according to claim 2, wherein the shower plate is controlled so as to make the temperature of the shower plate 200° C. or lower.

4. A process for producing a semiconductor, which comprises steps of:
    placing a wafer on a susceptor provided in a treating chamber,
    heating a susceptor through a heater, and
    supplying a feed gas together with a silicon containing gas from a shower plate toward the wafer in the treating chamber from a position above the wafer, wherein the temperature of the shower plate is 200° C. or lower, and after the wafer is placed on the susceptor, the wafer is secured onto the susceptor by a force.

* * * * *